United States Patent
Kanno et al.

(10) Patent No.: US 10,217,765 B2
(45) Date of Patent: Feb. 26, 2019

(54) SEMICONDUCTOR INTEGRATED CIRCUIT

(71) Applicant: FUJI ELECTRIC CO., LTD., Kawasaki (JP)

(72) Inventors: Hiroshi Kanno, Matsumoto (JP); Hitoshi Sumida, Matsumoto (JP); Masaharu Yamaji, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 15/415,380

(22) Filed: Jan. 25, 2017

(65) Prior Publication Data

US 2017/0133401 A1    May 11, 2017

Related U.S. Application Data

(63) Continuation of application No. PCT/JP2015/006498, filed on Dec. 28, 2015.

(30) Foreign Application Priority Data

Feb. 18, 2015  (JP) ................. 2015-029491

(51) Int. Cl.
*H01L 27/12* (2006.01)
*H01L 21/76* (2006.01)
(Continued)

(52) U.S. Cl.
CPC .......... *H01L 27/1203* (2013.01); *H01L 21/76* (2013.01); *H01L 21/822* (2013.01);
(Continued)

(58) Field of Classification Search
CPC ............ H03K 17/687; H03K 17/0063; H03K 2217/0072
(Continued)

(56) References Cited

U.S. PATENT DOCUMENTS 6,825,700 B2    11/2004  Hano
7,723,802 B2 *  5/2010  Terashima .......... H01L 27/0647
                                                            257/378

(Continued)

FOREIGN PATENT DOCUMENTS

CN    103038876    4/2013
CN    103797572    5/2014
(Continued)

OTHER PUBLICATIONS

Japanese Office Action dated Oct. 3, 2017 in corresponding Japanese Patent Application No. 2017-500485.
(Continued)

*Primary Examiner* — John W Poos

(57) ABSTRACT

A semiconductor integrated circuit includes a semiconductor layer of a first conductivity type which is stacked on a support substrate with an insulating layer interposed between the semiconductor layer and the support substrate, a first well region of a second conductivity type buried in an upper part of the semiconductor layer so as to be separated from the insulating layer, a second well region of the first conductivity type buried in an upper part of the first well region, and an isolation region of the first conductivity type buried in the upper part of the semiconductor layer such that the isolation region surrounds the first well region and is separated from the first well region and the insulating layer.

20 Claims, 10 Drawing Sheets

(51) Int. Cl.
| | |
|---|---|
| *H01L 21/84* | (2006.01) |
| *H01L 23/00* | (2006.01) |
| *H01L 27/04* | (2006.01) |
| *H01L 27/08* | (2006.01) |
| *H01L 29/06* | (2006.01) |
| *H01L 29/10* | (2006.01) |
| *H01L 21/822* | (2006.01) |
| *H01L 23/498* | (2006.01) |
| *H01L 27/092* | (2006.01) |
| *H03K 17/687* | (2006.01) |
| *H01L 21/8238* | (2006.01) |

(52) U.S. Cl.
CPC .......... *H01L 21/8238* (2013.01); *H01L 21/84* (2013.01); *H01L 23/49838* (2013.01); *H01L 24/32* (2013.01); *H01L 27/04* (2013.01); *H01L 27/08* (2013.01); *H01L 27/092* (2013.01); *H01L 29/0646* (2013.01); *H01L 29/0649* (2013.01); *H01L 29/1095* (2013.01); *H03K 17/687* (2013.01); *H01L 2224/32225* (2013.01); *H01L 2224/32227* (2013.01); *H01L 2224/48091* (2013.01); *H01L 2224/48106* (2013.01); *H01L 2224/48227* (2013.01); *H01L 2224/48465* (2013.01); *H01L 2224/73265* (2013.01); *H01L 2924/00014* (2013.01); *H01L 2924/13091* (2013.01); *H01L 2924/1426* (2013.01)

(58) Field of Classification Search
USPC ................ 327/109, 537, 564; 257/E21.023, 257/E21.598, E21.575
See application file for complete search history.

(56) References Cited

U.S. PATENT DOCUMENTS

| | | | |
|---|---|---|---|
| 8,148,809 | B2 | 4/2012 | Senda et al. |
| 8,278,719 | B2 | 10/2012 | Morris |
| 8,704,328 | B2 | 4/2014 | Yamaji |
| 8,860,172 | B2 | 10/2014 | Yamaji |
| 2003/0218186 | A1 | 11/2003 | Hano |
| 2007/0141794 | A1 | 6/2007 | Morris |
| 2010/0176480 | A1 | 7/2010 | Senda et al. |
| 2012/0061726 | A1* | 3/2012 | Tokura ............... H01L 29/0696 257/141 |
| 2013/0001736 | A1 | 1/2013 | Yamaji |
| 2014/0191281 | A1 | 7/2014 | Yamaji |
| 2016/0056282 | A1 | 2/2016 | Yamaji |

FOREIGN PATENT DOCUMENTS

| | | |
|---|---|---|
| JP | 2004-47937 | 2/2004 |
| JP | 2009-516361 | 4/2009 |
| JP | 2011-103429 | 5/2011 |
| JP | 2011-77164 | 4/2014 |
| JP | 2014-170821 | 9/2014 |
| WO | WO 2012/176347 A1 | 12/2012 |
| WO | WO 2013/039135 A1 | 3/2013 |
| WO | WO 2014/199608 A1 | 12/2014 |

OTHER PUBLICATIONS

International Search Report dated Mar. 29, 2016 in corresponding International Application No. PCT/JP2015/006498.
International Preliminary Report on Patentability dated Aug. 31, 2017 in corresponding International Patent Application No. PCT/JP2015/006498.
Chinese Office Action dated Dec. 5, 2018 in corresponding Chinese Patent Application No. 201580040953.3.

* cited by examiner

SEMICONDUCTOR INTEGRATED CIRCUIT

CROSS-REFERENCE TO RELATED APPLICATION

The application is a Continuation of International Application No. PCT/JP2015/006498, filed on Dec. 28, 2015, which claims benefit of priority to Japanese Patent Application No. 2015-029491, filed on Feb. 18, 2015, the entire contents of these documents are incorporated herein by reference.

BACKGROUND OF THE INVENTION

1. Field of the Invention

The present invention relates to a semiconductor integrated circuit, and more particularly, to a technique that can be effectively applied to a semiconductor integrated circuit such as a high voltage IC (HVIC) for driving a switching element.

2. Description of the Related Art

In general, a switching element of a power conversion bridge circuit is driven by a HVIC in a low-capacity inverter. In general, the HVIC includes, for example, a high-side driving circuit, a low-side driving circuit, a level shifter, and a control circuit. The HVIC transmits a driving signal for turning on and off a gate of a switching element from an output terminal according to a signal fed from the input terminal. In the power conversion bridge circuit, a switching element of a high-side circuit which receives a signal from the HVIC is operated to perform power conversion.

The high-side driving circuit which drives the high-side circuit is a complementary MOS (CMOS) circuit in which a p-channel MOSFET and an n-channel MOSFET as insulated-gate field-effect transistors are connected in a complementary topology. The p-channel MOSFET is provided in an n-type well region which is buried in an upper part of the p-type semiconductor substrate. The n-channel MOSFET is provided in a p-type well region which is buried in an upper part of the n-type well region. The high-side driving circuit operates, using a VS-potential as a reference potential and a VB-potential as a power-supply potential, and transmits a driving signal from an output terminal in accordance with a signal received from the level shift circuit. The VB-potential is the highest potential applied to the HVIC and is maintained at a level that is about 15 V higher than the VS-potential by, for example, a bootstrap capacitor in a normal state in which the VB-potential is not affected by noise. The VS-potential is potential at an output node portion which is a connection point between a high-side switching-element and a low-side switching-element of the power conversion bridge circuit and is changed between 0 V and several hundreds of volts during a power conversion process. In some cases, the VS-potential is a negative potential.

In the HVIC, various types of noise generated by the operation of the switching element are likely to be fed. Therefore, it is important to improve noise immunity such that an operation error or an operation failure does not occur and to ensure high reliability in the design of the HVIC. It is necessary to suppress the operation of a parasitic element in order to improve noise immunity. In particular, it is important to suppress the operation of a parasitic element which is provided immediately below a high-side circuit arrangement area (in the vicinity of a high-side switching-element driving circuit) in the vertical direction of the substrate. The reason is that the area of the parasitic element provided in the vertical direction of the substrate is large and a large amount of current is likely to flow.

JP 2004-47937 A discloses a technique in which an n-type high-concentration buried region is provided between a p-type semiconductor substrate and an n-type semiconductor layer to suppress the operation of a parasitic p-n-p transistor. JP 2011/103429 A discloses a semiconductor device that can suppress the generation of a displacement current for charging and discharging parasitic capacitance due to a dv/dt surge, using an SOI substrate.

SUMMARY OF INVENTION

An object of the invention is to provide a technique that can improve the reliability of a semiconductor integrated circuit.

In order to achieve the object of the invention, according to an aspect of the invention, there is provided a semiconductor integrated circuit including: a semiconductor layer of a first conductivity type stacked on a support substrate with an insulating layer interposed between the semiconductor layer and the support substrate; a first well region of a second conductivity type buried in an upper part of the semiconductor layer so as to be separated from the insulating layer; a second well region of the first conductivity type buried in an upper part of the first well region; and an isolation region of the first conductivity type buried in the upper part of the semiconductor layer such that the isolation region surrounds the first well region and is separated from the first well region and the insulating layer.

These and/or other objects and new characteristics of the invention will become apparent from the following description of the Specification and the accompanying Drawings.

DESCRIPTION OF EMBODIMENTS

Figure 1:
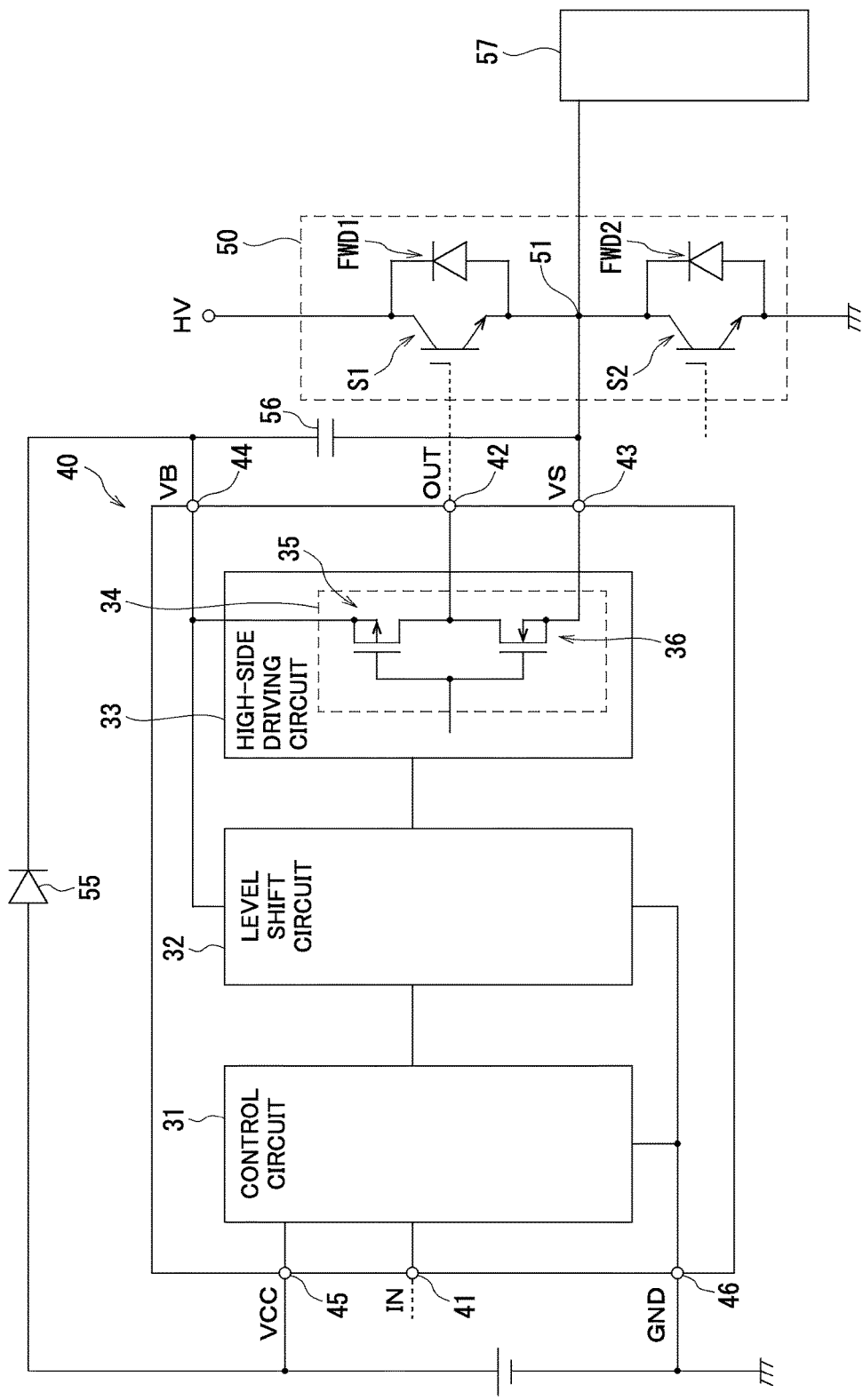
FIG. 1 is a circuit diagram schematically illustrating the structure of a semiconductor integrated circuit according to a first embodiment of the present invention.

Hereinafter, with reference to the Drawings, semiconductor integrated circuits according to first and second embodiments of the invention will be explained in detail.

In the Specification, a "first main electrode region" is assigned to a semiconductor region which will be a source region or a drain region in a field-effect transistor (FET) or a static induction transistor (SIT), an emitter region or a collector region in an insulated gate bipolar transistor (IGBT) and an anode region or a cathode region in a static induction thyristor (SI Thy) or a gate turn-off thyristor (GTO). A "second main electrode region" is assigned to a semiconductor region which will not be the first main electrode region and will be the source region or the drain region in the FET or the SIT, the emitter region or the collector region in the IGBT, and the anode region or the cathode region in the SI thyristor or the GTO. That is, when the first main electrode region is the source region, the second main electrode region means the drain region. When the first main electrode region is the emitter region, the second main electrode region means the collector region. When the first main electrode region is the anode region, the second main electrode region means the cathode region. In the following first and second embodiments, the description is focused on a power IC using an insulated-gate field-effect transistor. Therefore, the source region is referred to as the "first main electrode region" and the drain region is referred to as the "second main electrode region".

In the following first and second embodiments, an example in which a first conductivity type is a p type and a second conductivity type is an n type will be described. However, the relationship between the conductivity types may be reversed such that the first conductivity type is an n type and the second conductivity type is a p type. In the Specification and the accompanying Drawings, in the layers or regions having "n" or "p" appended thereto, an electron or a hole means a majority carrier. In addition, symbols "+" and "−" added as superscripts to p or n mean that the impurity concentration of a semiconductor region is higher and lower than that of a semiconductor region without the symbols. In the following description, the terms "top" and "lower" in, for example, "top surface" and "bottom surface" are defined depending on cross-sectional views. For example, when the direction of a semiconductor integrated circuit is changed by 90° and is then observed, the terms "top" and "bottom" change to "left" and "right", respectively. When the observing direction of the semiconductor integrated circuit is changed by 180°, the terms "top" and "bottom" shall be reversed.

In the description of the following first and second embodiments and the accompanying Drawings, the same components are denoted by the same reference numerals and the description thereof will not be repeated. In addition, in the accompanying Drawings described in the following first and second embodiments, for ease of viewing or understanding, a scale and a dimensional ratio are different from the actual scale and dimensional ratio. The invention is not limited to the following first and second embodiments as long as it does not depart from the scope and spirit thereof.

First Embodiment

As illustrated in FIG. 1, a semiconductor integrated circuit 40 according to a first embodiment of the present invention is a power IC including, for example, a control circuit 31, a level shift circuit 32, a high-side driving circuit 33, and a low-side driving circuit (not illustrated). In addition, the semiconductor integrated circuit 40 according to the first embodiment is a high voltage power IC that drives a power conversion unit 50 corresponding to, for example, one phase of a power conversion bridge circuit. The semiconductor integrated circuit 40 according to the first embodiment transmits a driving signal from an output terminal 42 to turn on and off a gate of a switching element implementing the power conversion unit 50, in response to a signal fed from an input terminal 41.

As illustrated in FIG. 1, in the power conversion unit 50, a high-side switching-element S1 and a low-side switching-element S2 are connected in series to implement a high-side circuit. The high-side switching-element S1 and the low-side switching-element S2 are, for example, active elements such as IGBTs. Freewheeling diode FWD1 is connected in parallel to the high-side switching-element S1 in a reverse direction, and freewheeling diode FWD2 is connected in parallel to the low-side switching-element S2 in a reverse direction.

The high-side switching-element S1 and the low-side switching-element S2 are connected in series between a high-voltage main power supply HV which is on the positive electrode side and a ground (GND) potential which is on the negative electrode side of the main power supply HV. A VS-terminal 43 to which a VS-potential is applied as a second potential is connected to a connection point 51 between the high-side switching-element S1 and the low-side switching-element S2. The connection point 51 is an output point of the power conversion unit 50 corresponding to one phase of the power conversion bridge circuit. The low-side switching-element S2 is connected between the connection point 51 and the GND potential. For example, a motor is connected as a load 57 to the connection point 51.

While the semiconductor integrated circuit 40 is operating, the VS-potential applied to the VS-terminal 43 is repeatedly raised and dropped between the high-potential-side potential (for example, about 400 V) and the low-potential-side potential (GND potential) of the main power supply HV by the complementary turn-on and turn-off of the high-side switching-element S1 and the low-side switching-element S2 implementing the high-side circuit and is changed from 0 V to several hundreds of volts.

The high-side driving circuit 33 includes a gate driving circuit 34. The gate driving circuit 34 is, for example, a CMOS circuit in which an n-channel MOSFET (hereinafter, referred to as an nMOS) 36 as a second-conductivity-type-channel first FET which is an active element and a p-channel MOSFET (hereinafter, referred to as a pMOS) 35 as a first-conductivity-type-channel second FET which is an active element are connected in series to each other in a complementary topology. Specifically, a source of the pMOS 35 is connected to the VB-terminal 44 and a drain of the pMOS 35 is connected to a drain of the nMOS 36. A source of the nMOS 36 is connected to the VS-terminal 43.

The gate driving circuit 34 operates, using the VS-potential applied to the VS-terminal 43 as a reference potential and the VB-potential which is applied as a first potential to the VB-terminal 44, as a power-supply potential and transmits a driving signal from the output terminal 42 in accordance with a signal received from the level shift circuit 32 to drive the high-side switching-element S1.

The control circuit 31 operates, using the GND potential applied to a ground (GND) terminal 46 as the reference potential and a VCC-potential applied to a VCC-terminal 45 as the power-supply potential, and generates a low-side-level on/off signal for turning on and off the high-side switching-element S1 and a low-side-level on/off signal for turning on and off the low-side switching-element S2. The GND potential is a common potential.

The level shift circuit 32 converts the low-side-level on/off signal generated by the control circuit 31 into a high-side-level on/off signal.

In the semiconductor integrated circuit 40 according to the first embodiment, when the high-side switching-element S1 is driven, the control circuit 31 generates the low-side-level on/off signal for turning on and off the high-side switching-element S1. The low-side-level on/off signal is converted into the high-side-level on/off signal by the level shift circuit 32 and the high-side-level on/off signal is fed to the high-side driving circuit 33.

The on/off signal which is fed from the control circuit 31 to the high-side driving circuit 33 is fed to a gate of the high-side switching-element S1 through the gate driving circuit 34. The high-side switching-element S1 is turned on and off on the basis of the on/off signal from the control circuit 31.

A bootstrap diode 55 which is an external element is connected to between the VCC-terminal 45 and the VB-terminal 44. In addition, a bootstrap capacitor 56 which is an external element is connected between the VB-terminal 44 and the VS-terminal 43. The bootstrap diode 55 and the bootstrap capacitor 56 generate power for driving the high-side switching-element S1.

The VB-potential is the highest potential applied to the semiconductor integrated circuit 40 and is maintained at a level that is about 15 V higher than the VS-potential by the bootstrap capacitor 56 in a normal state in which the VB-potential is not affected by noise. The VS-potential is potential at the connection point (output node portion) 51 between the high-side switching-element S1 and the low-side switching-element S2 of the power conversion bridge circuit and is changed between 0 V and several hundreds of volts during a power conversion process. In some cases, the VS-potential is a negative potential.

Next, the detailed structure of the semiconductor integrated circuit 40 according to the first embodiment will be explained.

Figure 2:
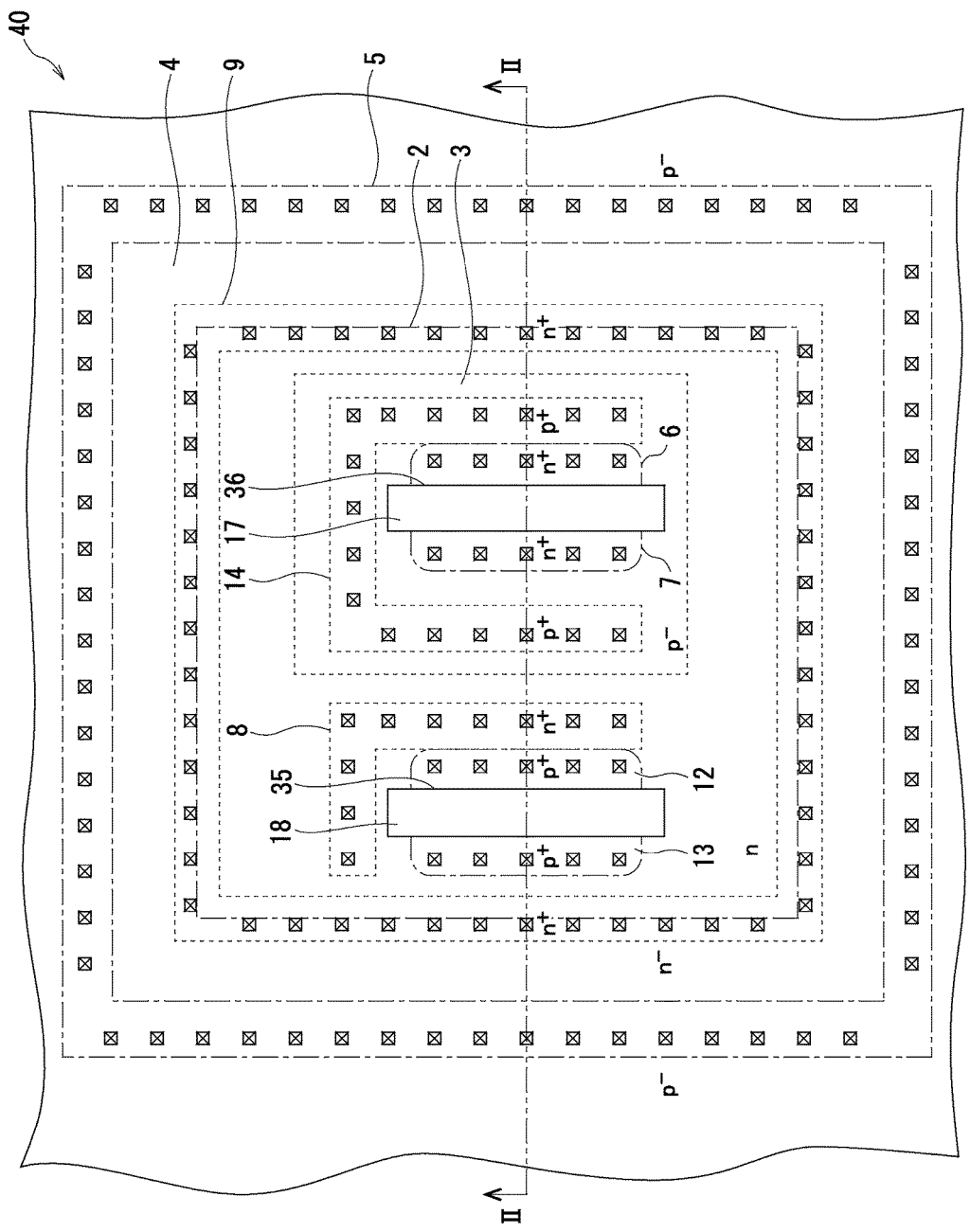
FIG. 2 is a plan view illustrating a main portion of the planar layout of each semiconductor region in a high-side-driver arrangement-area of the semiconductor integrated circuit according to the first embodiment of the present invention.
Figure 3:
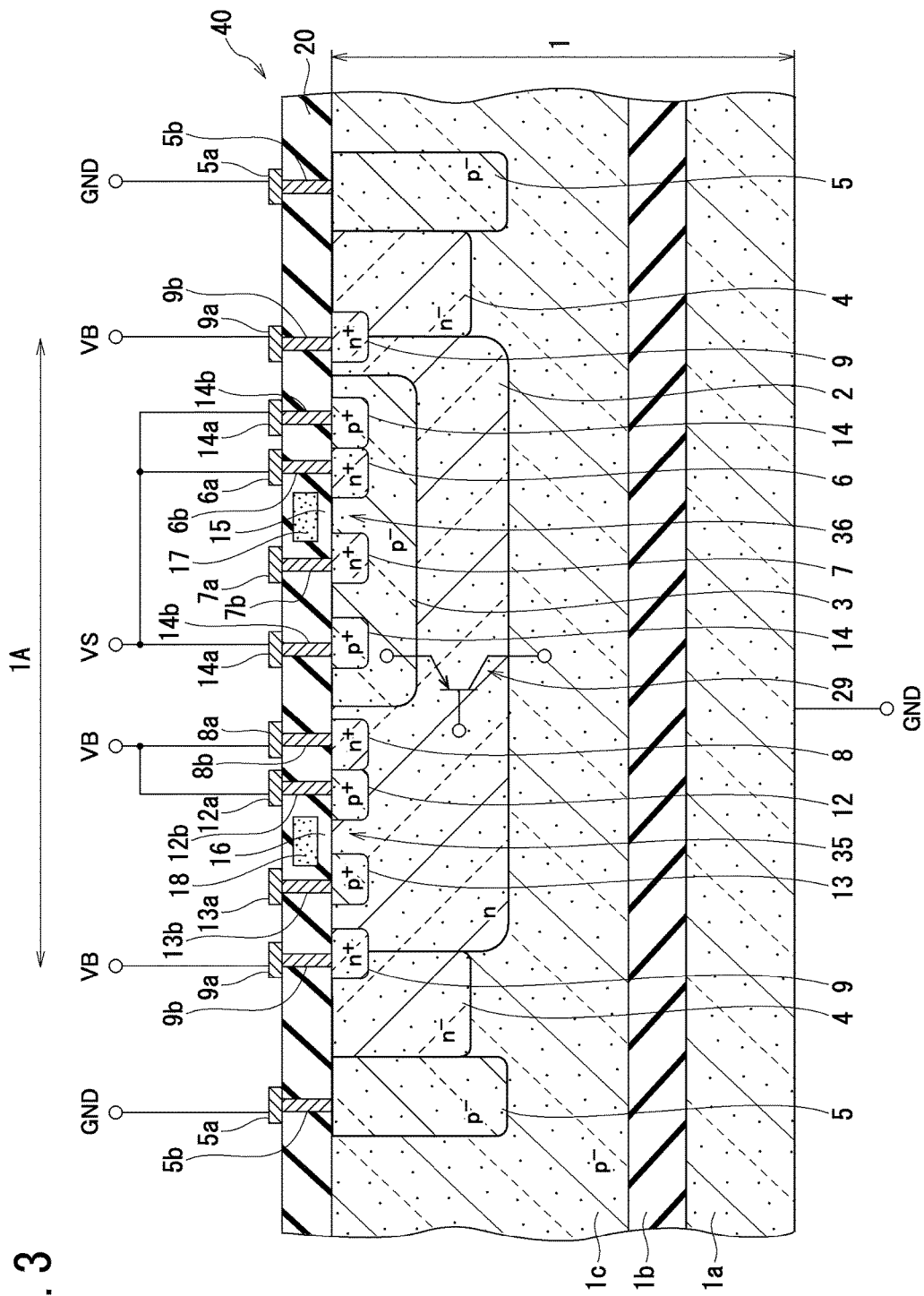
FIG. 3 is a cross-sectional view illustrating a main portion of a cross-sectional structure taken along the line II-II of FIG. 2.

As illustrated in FIG. 2 and FIG. 3, the semiconductor integrated circuit 40 according to the first embodiment is a power IC in which an element isolation structure manufactured on a semiconductor substrate 1 by a self-isolated IC process is implemented. The semiconductor substrate 1 has a structure in which a semiconductor layer 1c of a first conductivity type (p⁻ type) is laminated on a support substrate 1a with an insulating layer 1b. For example, a first-conductivity-type (p⁻) single-crystalline silicon substrate is used as the support substrate 1a. The insulating layer 1b is, for example, a silicon oxide film. The semiconductor layer 1c is, for example, a single-crystalline silicon substrate with a specific resistivity of about 100 Ωcm or more. That is, the semiconductor substrate 1 has a silicon-on-insulator (SOI) structure.

As illustrated in FIG. 3, a first well region 2 of a second conductivity type (n type) is selectively buried in an upper part (surface layer portion) that is close to a top surface which is a main surface of the semiconductor layer 1c and a second well region 3 of the first conductivity type (p⁻ type) is selectively buried in an upper part of the first well region 2. In addition, a breakdown-voltage improving-region (well region) 4 of the second conductivity type (n⁻ type) and an isolation region (well region) 5 of the first conductivity type (p⁻ type) are selectively buried in the upper part of the semiconductor layer 1c. The first well region 2 and the second well region 3 are buried in a high-side-driver arrangement-area 1A of the semiconductor substrate 1. The first well region 2 has an impurity concentration of, for example, about $1 \times 10^{14}/cm^3$ to $1 \times 10^{17}/cm^3$. The second well region 3 has an impurity concentration of, for example, about $1 \times 10^{14}/cm^3$ to $1 \times 10^{18}/cm^3$.

As illustrated in FIG. 2 and FIG. 3, the first well region 2 is surrounded by the breakdown-voltage improving-region 4 and comes into contact with the breakdown-voltage improving-region 4. The breakdown-voltage improving-region 4 is surrounded by the isolation region 5 and comes into contact with the isolation region 5. That is, the breakdown-voltage improving-region 4 is provided between the first well region 2 and the isolation region 5 and comes into contact with the first well region 2 and the isolation region 5. The breakdown-voltage improving-region 4 has a lower impurity concentration than the first well region 2. The isolation region 5 has a higher impurity concentration than the semiconductor layer 1c.

As illustrated in FIG. 3, the pMOS 35 is an active element that is provided in the upper part of the first well region 2. The nMOS 36 is an active element that is provided in the upper part of the second well region 3. The first well region 2 is an isolation region that electrically isolates the pMOS 35 from the semiconductor layer 1c and the second well region 3 is an isolation region that electrically isolates the nMOS 36 from the first well region 2.

The pMOS 35 includes a channel formation region which is implemented by the first well region 2, a gate insulating film 16 which is selectively laminated on the top surface of the first well region 2 buried in the upper portion of the semiconductor layer 1c, and a gate electrode 18 which is provided over the channel formation region with the gate insulating film 16 interposed between the gate electrode 18 and the channel formation region. In addition, the pMOS 35 includes a first main electrode region (source region) 12 of the first conductivity type (p⁺ type) which is selectively buried in the upper part of the first well region 2 and a second main electrode region (drain region) 13 of the first conductivity type (p⁺ type) which is selectively buried in the upper part of the first well region 2 being separated from the first main electrode region 12, such that the channel formation regions can be interposed between the first main electrode region 12 and the second main electrode region 13.

The nMOS 36 includes a channel formation region which is implemented by the second well region 3, a gate insulating film 15 which is selectively laminated on the top surface of the second well region 3 buried in the upper portion of the semiconductor layer 1c, and a gate electrode 17 which is provided over the channel formation region with the gate insulating film 15 interposed between the gate electrode 17 and the channel formation region. In addition, the nMOS 36 includes a first main electrode region (source region) 6 of the second conductivity type (n⁺ type) which is selectively buried in the upper part of the second well region 3 and a second main electrode region (drain region) 7 of the second conductivity type (n⁺ type) which is selectively buried in the upper part of the second well region 3 being separated from the first main electrode region 6, such that the channel formation regions can be interposed between the first main electrode region 6 and the second main electrode region 7.

The gate insulating films 15 and 16 are, for example, silicon dioxide films. The gate electrodes 17 and 18 are, for example, polysilicon films into which impurities for reducing a resistance value are doped. Each of the first main electrode region 12 and the second main electrode region 13 of the pMOS 35 has a higher impurity concentration than the first well region 2. Each of the first main electrode region 6 and the second main electrode region 7 of the nMOS 36 has a higher impurity concentration than the second well region 3.

Examples of the silicon dioxide film include a thermally oxidized film which is formed by a thermal oxidation method and a deposited oxide film which is formed by a chemical vapor deposition (CVD) method. It is preferable that the thermally oxidized film with highly densified structure be used as the gate insulating films 15 and 16 in the MOSFET. In the first embodiment, the MOSFET in which the gate insulating films 15 and 16 are silicon dioxide films is described. However, the transistor may be a MISFET in which the gate insulating film is a silicon nitride film or a stacked film of a silicon nitride film and a silicon oxide film.

As illustrated in FIG. 3, a first contact region 8 of the second conductivity type ($n^+$ type) which has a higher impurity concentration than the first well region 2 is selectively buried in the upper part of the first well region 2. A third contact region 9 of the second conductivity type ($n^+$ type) is selectively buried in the upper parts of the first well region 2 and the breakdown-voltage improving-region 4 so as to bridge the first well region 2 and the breakdown-voltage improving-region 4. The third contact region 9 has a higher impurity concentration than the first well region 2 and the breakdown-voltage improving-region 4. A second contact region 14 of the first conductivity type ($p^+$ type) which has a higher impurity concentration than the second well region 3 is selectively buried in the upper part of the second well region 3.

As illustrated in FIG. 3, an interlayer insulating film 20 is laminated on the top surface of the semiconductor layer 1c so as to cover the gate electrodes 17 and 18. A ground electrode 5a, a source electrode 6a, a drain electrode 7a, a first contact electrode 8a, a third contact electrode 9a, a source electrode 12a, a drain electrode 13a, and a second contact electrode 14a are laminated on the interlayer insulating film 20. The electrodes 5a, 6a, 7a, 8a, 9a, 12a, 13a, and 14a are made of, for example, aluminum films.

As illustrated in FIG. 3, the ground electrode 5a is electrically connected to the isolation region 5 through a conductive plug 5b which is buried in the interlayer insulating film 20. The source electrode 6a is electrically connected to the first main electrode region (source region) 6 through a conductive plug 6b which is buried in the interlayer insulating film 20. The drain electrode 7a is electrically connected to the second main electrode region (drain region) 7 through a conductive plug 7b which is buried in the interlayer insulating film 20.

As illustrated in FIG. 3, the first contact electrode 8a is electrically connected to the first contact region 8 through a conductive plug 8b which is buried in the interlayer insulating film 20. The third contact electrode 9a is electrically connected to the third contact region 9 through a conductive plug 9b which is buried in the interlayer insulating film 20.

As illustrated in FIG. 3, the source electrode 12a is electrically connected to the first main electrode region (source region) 12 through a conductive plug 12b which is buried in the interlayer insulating film 20. The drain electrode 13a is electrically connected to the second main electrode region (drain region) 13 through a conductive plug 13b which is buried in the interlayer insulating film 20. The second contact electrode 14a is electrically connected to the second contact region 14 through a conductive plug 14b which is buried in the interlayer insulating film 20.

As can be seen from FIG. 1 and FIG. 3, the ground electrode 5a is electrically connected to the GND terminal 46 illustrated in FIG. 1 and the GND potential is applied to the ground electrode 5a through the GND terminal 46. The source electrode 6a and the second contact electrode 14a are electrically connected to the VS-terminal 43 illustrated in FIG. 1 and the VS-potential is applied to the source electrode 6a and the second contact electrode 14a through the VS-terminal 43. The first contact electrode 8a, the third contact electrode 9a, and the source electrode 12a are electrically connected to the VB-terminal 44 illustrated in FIG. 1 and the VB-potential is applied to the first contact electrode 8a, the third contact electrode 9a, and the source electrode 12a through the VB-terminal 44.

That is, the GND potential is applied as the reference potential to the isolation region 5. In addition, the VB-potential which is different from the GND potential is applied as the first potential to the first well region 2 and the breakdown-voltage improving-region 4 through the third contact region 9 which is provided across the first well region 2 and the breakdown-voltage improving-region 4 and the first contact region 8 buried in the first well region 2. The VS-potential which is different from the GND potential and the VB-potential is applied as the second potential to the second well region 3 through the second contact region 14. The VB-potential is applied to the first main electrode region 12 of the pMOS 35 and the VS-potential is applied to the first main electrode region 6 of the nMOS 36.

As illustrated in FIG. 2, the first contact region 8 has an L-shape in a plan view and is provided such that a first portion which extends along a gate width direction (the longitudinal direction of the gate electrode 18) of the pMOS 35 comes into contact with the first main electrode region (source region) 12 of the pMOS 35 and a second portion which extends from the first portion along a gate length direction (the width direction of the gate electrode 18) of the pMOS 35 is separated from the first main electrode region 12 and the second main electrode region 13 of the pMOS 35.

As illustrated in FIG. 2, the second contact region 14 has a U-shape in a plan view and is provided so as to surround the nMOS 36. The second contact region 14 is provided such that a first portion which extends in a gate width direction (the longitudinal direction of the gate electrode 17) of the nMOS 36 comes into contact with the first main electrode region (source region) 6 of the nMOS 36 and a second portion which extends from the first portion along a gate length direction (the width direction of the gate electrode 17) of the nMOS 36 and a third portion which extends from the second portion along a gate width direction of the nMOS 36 are separated from the first main electrode region 6 and the second main electrode region 7 of the nMOS 36.

The third contact region 9 has a ring-shaped plane pattern that extends in a ring shape so as to surround the pMOS 35 and the nMOS 36.

As illustrated in FIG. 3, the first well region 2, the breakdown-voltage improving-region 4, and the isolation region 5 are buried in an upper part of the semiconductor layer 1c so as to be separated from the insulating layer 1b laminated on the bottom surface of the semiconductor layer 1c. In other words, the semiconductor layer 1c has a thickness at which the first well region 2, the breakdown-voltage improving-region 4, and the isolation region 5 are separated from the insulating layer 1b.

The insulating layer 1b is provided so as to cover the entire bottom surface of the semiconductor layer 1c and faces the entire bottom of the first well region 2. That is, the insulating layer 1b is provided immediately below the first well region 2 so as to be separated from the first well region 2 and the bottom surface of the support substrate 1a.

Figure 6:
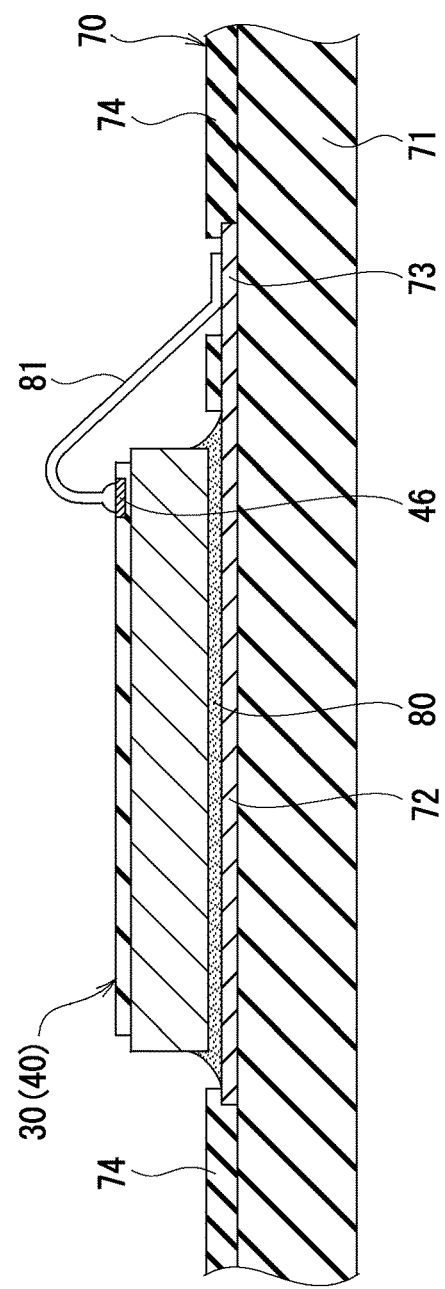
FIG. 6 is a cross-sectional view illustrating a main portion of a state in which the semiconductor integrated circuit according to the first embodiment of the present invention is mounted on a wiring substrate.

The semiconductor integrated circuit 40 according to the first embodiment implements a semiconductor chip 30 illustrated in FIG. 6. The semiconductor chip 30 is mounted as the semiconductor integrated circuit 40 on a wiring substrate 70 illustrated in FIG. 6. The wiring substrate 70 includes a core base 71 which is made of an insulating material, such as ceramics, and a die pad 72 and a wire connection portion 73 which are laminated on a top surface of the core base 71 and are made of a conductive metal material. The die pad 72 and the wire connection portion 73 are integrally formed and are electrically connected to each other. In addition, a protective film 74 which is made of an insulating material is laminated on the top surface of the core base 71. The die pad 72 and the wire connection portion 73 are exposed through opening portions cut in the protective film 74.

Figure 7:
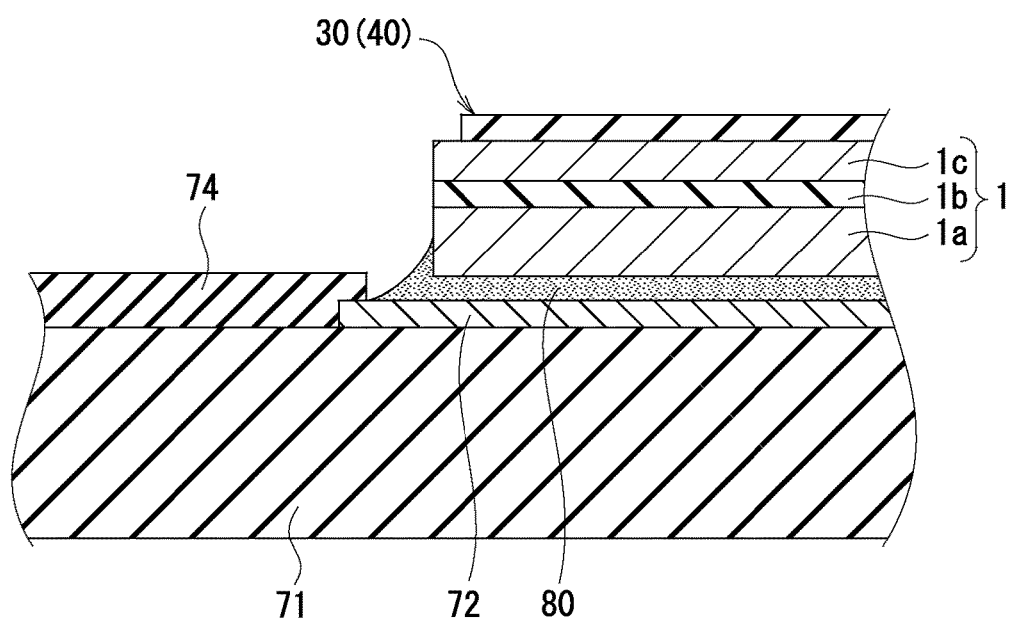
FIG. 7 is an enlarged cross-sectional view of a main portion of FIG. 6.

As illustrated in FIG. 7, the semiconductor chip 30 is bonded and fixed to the die pad 72 through an adhesive 80 which is made of, for example, conductive silver paste and is provided between the bottom surface of the support substrate 1a implementing the semiconductor substrate 1 and the top surface of the die pad 72. As illustrated in FIG. 6, the GND terminal 46 is laminated on the top surface of the semiconductor chip 30. The GND terminal 46 is electrically connected to the wire connection portion 73 through a bonding wire 81.

The GND potential is applied to the die pad 72 and the wire connection portion 73, which is not illustrated in FIG. 6 and FIG. 7. In this case, since the GND potential is applied to the bottom surface of the support substrate 1a, the GND potential is also applied to the support substrate 1a and is fixed. The objective of the application of the GND potential to the bottom surface is to prevent the effect of the stray capacitance of the semiconductor chip 30 from affecting other semiconductor chips or circuits, after the semiconductor chip 30 is mounted on the wiring substrate 70, or to stabilize power-supply potential in the semiconductor chip 30.

The VB-potential of the first potential and the VS-potential of the second potential are applied so that the p-n junction interface between the first well region 2 and the second well region 3 can be reversely biased, during the normal operation of the semiconductor integrated circuit 40.

The semiconductor integrated circuit 40 according to the first embodiment is manufactured by a self-isolated IC process. In the semiconductor integrated circuit 40 manufactured by the self-isolated IC process, as illustrated in FIG. 3, a parasitic p-n-p bipolar transistor 29 including the p⁻ second well region 3, the n-type first well region 2, and the p⁻ semiconductor layer 1c is established in the high-side-driver arrangement-area 1A. The base, emitter, and collector of the parasitic p-n-p bipolar transistor 29 are connected to the VB-terminal 44, the VS-terminal 43, and the GND terminal 46, respectively.

During the normal operation of the semiconductor integrated circuit 40, since the VB-potential as the power-supply potential is higher than the VS-potential, which is an intermediate potential, the parasitic p-n-p bipolar transistor 29 does not operate. However, the parasitic p-n-p bipolar transistor 29 is turned on when the VB-potential is lower than the VS-potential by 0.6 V, which is the built-in potential of the p-n junction interface of silicon, or more due to a negative voltage surge, that is, when the following potential relationship is satisfied:

$$VB\text{-potential} < (VS\text{-potential} - 0.6 \text{ [V]}).$$

The reason why the potential relationship of the VB-potential<(the VS-potential−0.6 [V]) is satisfied will be explained. As illustrated in FIG. 1, when the power conversion unit 50 is driven in the semiconductor integrated circuit 40, for example, the bootstrap capacitor 56 which is an external element is connected between the VB-terminal 44 and the VS-terminal 43. The potential difference (the voltage between VB and VS) between the VB-potential applied to the VB-terminal 44 and the VS-potential applied to the VS-terminal 43 is maintained by charge stored in the bootstrap capacitor 56. For example, the bootstrap diode 55 and other wires are connected to the VB-terminal 44. The load 57 and other wires are connected to the VS-terminal 43. Different circuits are connected to the VB-terminal 44 and the VS-terminal 43 and different types of parasitic capacitance are added to the VB-terminal 44 and the VS-terminal 43. Therefore, in some cases, when the VB-potential varies, it is difficult for the VS-potential to sufficiently follow the variation of the VB-potential. As a result, when the VB-potential is changed by a negative voltage surge, it may be difficult to maintain the potential difference between the VB-potential and the VS-potential. Therefore, when the difference between a variation in the VB-potential and a variation in the VS-potential is large, the VB-potential<(VS-potential−0.6 [V]) can be satisfied.

Figure 10:
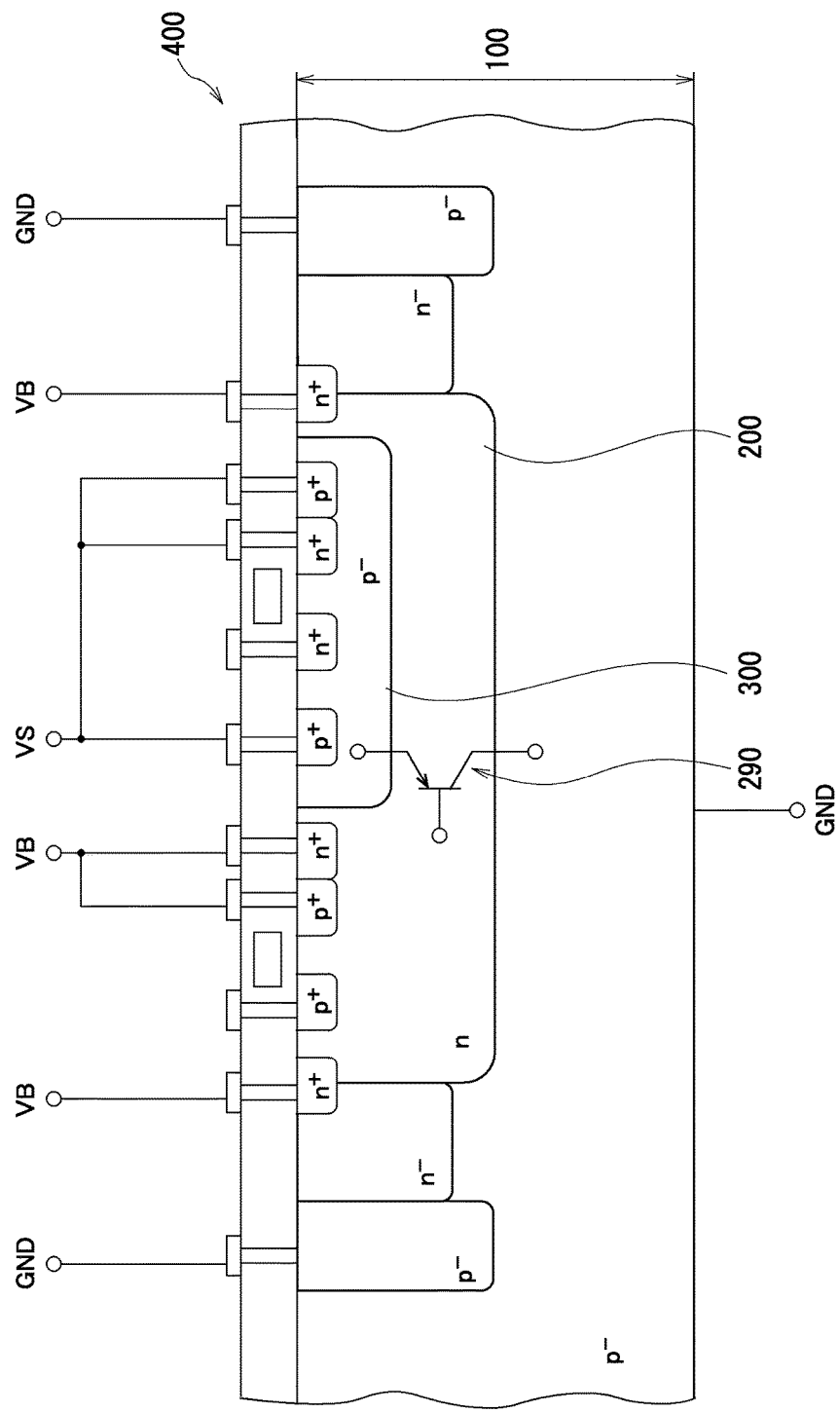
FIG. 10 is a cross-sectional view illustrating a main portion of a semiconductor integrated circuit according to the earlier technology.

Here, an earlier semiconductor integrated circuit according to the earlier technology will be explained. As illustrated in FIG. 10, an earlier semiconductor integrated circuit (HVIC) 400 uses a single-layer p⁻ semiconductor substrate (bulk substrate) 100, unlike the semiconductor integrated circuit 40 according to the first embodiment. A parasitic p-n-p bipolar transistor 290 including a second well region 300 of a p⁻ type, a first well region 200 of an n type, and the bulk substrate 100 of a p⁻ type is established in the semiconductor integrated circuit 400. The base, emitter, and collector of the parasitic p-n-p bipolar transistor 290 are connected to the VB-terminal 44, the VS-terminal 43, and the GND terminal 46, respectively, with reference to FIG. 1. When the earlier semiconductor integrated circuit 400 is mounted on the wiring substrate 70, similarly to the semiconductor integrated circuit 40 according to the first embodiment, the bottom surface of the bulk substrate 100 is fixed to the GND potential.

If an undesirable case in which the unrequired potential relationship of the VB-potential<(the VS-potential−0.6 [V]) is established, the parasitic p-n-p bipolar transistor 290 is turned on, in the earlier semiconductor integrated circuit (HVIC) 400. When the bottom surface of the bulk substrate 100 is fixed to the GND potential in the earlier semiconductor integrated circuit 400, a large amount of current flows to a current path between the VS-terminal 43 to which the high voltage of the high-side circuit (the high-potential-side potential of HV) is applied and the GND terminal 46. That is, a large amount of current flows in the current path defined from the second well region 300 buried in an upper part of the bulk substrate 100 to the bottom surface of the bulk substrate 100. Therefore, an operation error or an operation failure occurs in the semiconductor integrated circuit 400 due to the generation of heat caused by the large amount of current, which causes a reduction in reliability. Because the area of the parasitic p-n-p bipolar transistor 290 provided in the vertical direction of the substrate is large and the area of the current path from the second well region 300 to the bottom surface of the bulk substrate 100 is also large, a large amount of current flows to the current path from the second well region 300 to the bottom surface of the bulk substrate 100 will be explained.

In contrast, in the semiconductor integrated circuit 40 according to the first embodiment, as illustrated in FIG. 3, the insulating layer 1b is provided immediately below the first well region 2 so as to be separated from the first well region 2 and the bottom surface of the support substrate 1a. Therefore, the current path (the current path from the second well region 3 to the bottom surface of the support substrate 1a) of the parasitic p-n-p bipolar transistor 29 in the vertical direction of the substrate is blocked by the insulating layer 1b and the collector of the parasitic p-n-p bipolar transistor 29 is isolated from the bottom surface of the support substrate 1a. Therefore, it is possible to reduce the current amplification factor $H_{FE}$ of the parasitic p-n-p bipolar transistor 29 and to suppress the operation of the parasitic p-n-p bipolar transistor 29. As a result, it is possible to prevent the occurrence of an operation error or an operation failure in the semiconductor integrated circuit 40, which is ascribable to the generation of heat by the flow of a large amount of current caused by the operation of the parasitic p-n-p bipolar transistor 29. And thus, it is possible to improve the reliability of the semiconductor integrated circuit 40 according to the first embodiment.

Figure 4:
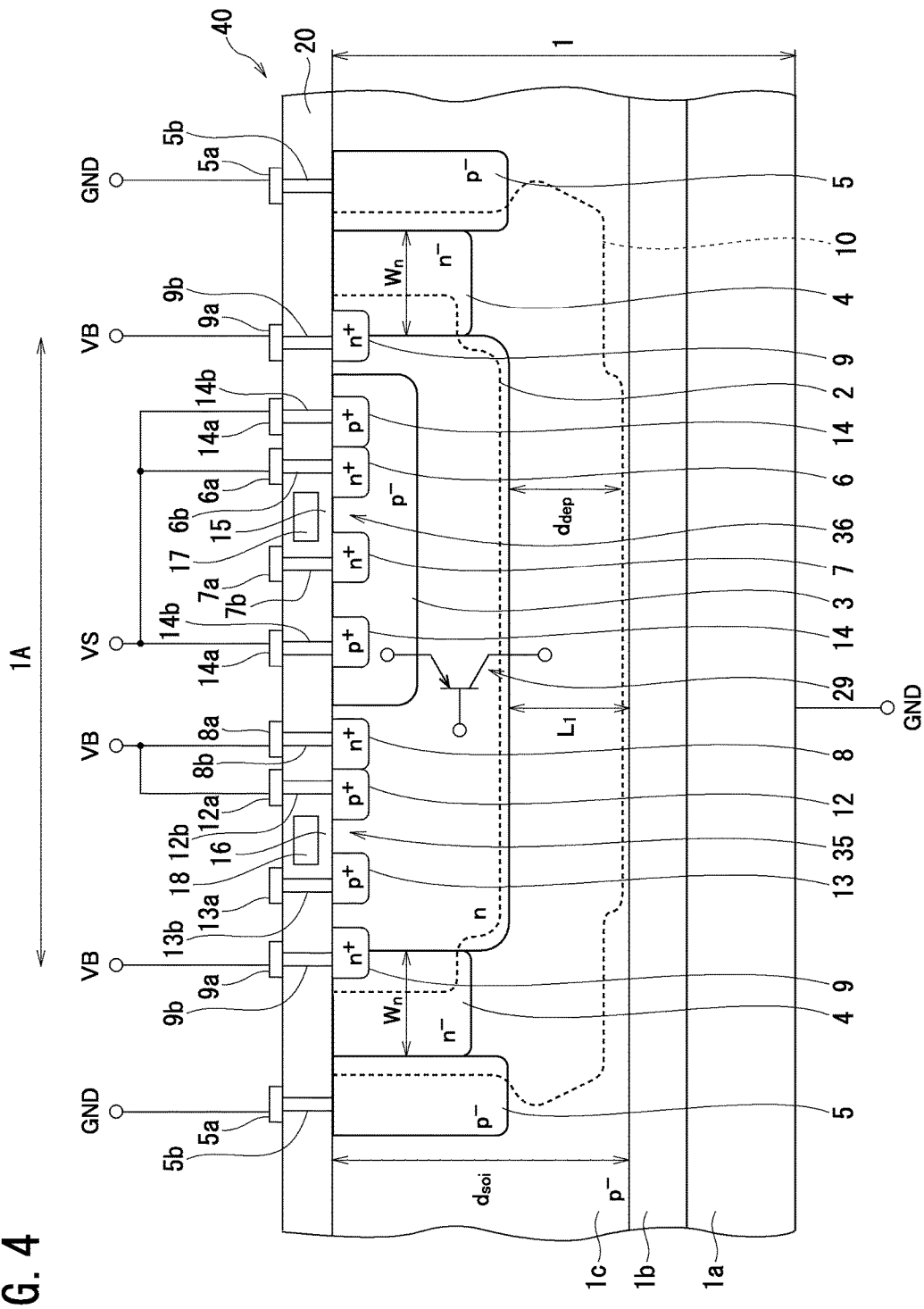
FIG. 4 is a cross-sectional view illustrating a main portion of the spreading of a depletion layer in the semiconductor integrated circuit according to the first embodiment of the present invention.

During the normal operation of the semiconductor integrated circuit 40, as illustrated in FIG. 4, a depletion layer 10 is formed in the p-n junction interface between the p⁻ semiconductor layer 1c and the p⁻ isolation region 5, and the n-type first well region 2 and the n⁻ breakdown-voltage improving-region 4. When the depletion layer 10 comes into contact with the insulating layer 1b, a potential distribution is changed, which causes a reduction in the breakdown voltage. Therefore, in the semiconductor integrated circuit 40 according to the first embodiment, the thickness $d_{soi}$ of the semiconductor layer 1c is set to a value at which the depletion layer 10 does not come into contact with the insulating layer 1b, that is, the depletion layer 10 is separated from the insulating layer 1b.

Figure 5:
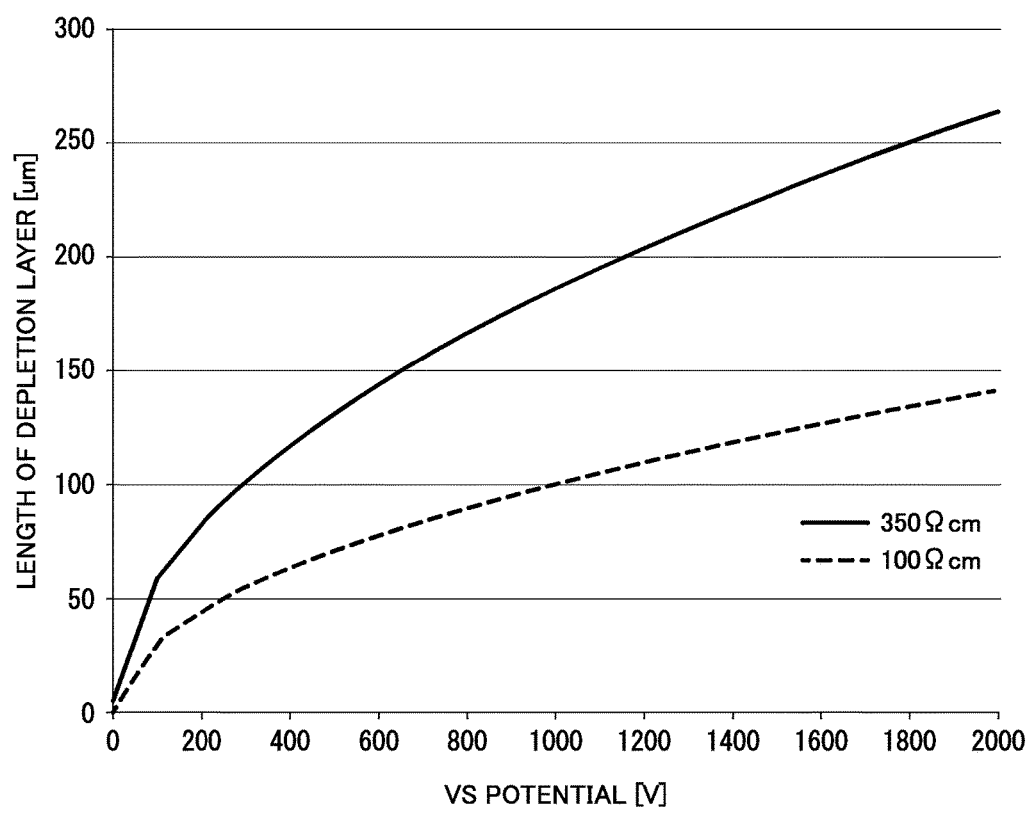
FIG. 5 is a diagram illustrating an example of the simulation result of the depletion layer in the semiconductor integrated circuit according to the first embodiment of the present invention.

FIG. 5 is a diagram illustrating an example of the simulation result of the depletion layer in the semiconductor integrated circuit 40 according to the first embodiment. FIG. 5 illustrates data for the length $d_{dep}$ of the depletion layer 10 which is spread (extends) from the p-n junction interface between the first well region 2 and the semiconductor layer 1c to the semiconductor layer 1c when potential is applied such that the p-n junction interface between the first well region 2 and the semiconductor layer 1c is biased in the reverse direction, with reference to FIG. 4. In the calculation of the data, the specific resistivity of the semiconductor layer 1c is, for example, 350 Ωcm and 100 Ωcm and the impurity concentration of the first well region 2 is, for example, $2\times10^{16}$ cm³.

In the semiconductor integrated circuit 40, the rated breakdown voltage is designed to be mainly 600 V and 1200 V. In a case in which the specific resistivity is 350 Ωcm, as represented by a solid line in FIG. 5, the length $d_{dep}$ of the depletion layer 10 is about 150 μm when the VS-potential is 600 V and is about 200 μm when the VS-potential is 1200 V. Since the depth of the first well region 2 is about 10 μm, the thickness $d_{soi}$ of the semiconductor layer 1c is set such that the depletion layer 10 is separated from the insulating layer 1b, considering the depth of the first well region 2. When the rated breakdown voltage is designed to be 600 V, the thickness $d_{soi}$ of the semiconductor layer 1c is preferably equal to or greater than about 160 μm (150 μm+10 μm). When the rated breakdown voltage is designed to be 1200 V, the thickness $d_{soi}$ of the semiconductor layer 1c is preferably equal to or greater than 210 μm (200 μm+10 μm). When the VS-potential is 1700 V, the length $d_{dep}$ of the depletion layer 10 is about 250 μm, considering a breakdown voltage margin. In this case, the thickness $d_{soi}$ of the semiconductor layer 1c is preferably equal to or greater than 260 μm (250 μm+10 μm). When the VS-potential is 400 V less than 600 V, the length $d_{dep}$ of the depletion layer 10 is about 110 μm. In this case, the thickness $d_{soi}$ of the semiconductor layer 1c is preferably equal to or greater than 120 μm (110 μm+10 μm). As such, when the rated breakdown voltage is low, it is possible to reduce the thickness $d_{soi}$ of the semiconductor layer 1c.

In other words, a distance $L_1$ between the bottom of the first well region 2 and the insulating layer 1b is preferably equal to or greater than 150 μm when the VS-potential is 600 V, is preferably equal to or greater than 200 μm when the VS-potential is 1200 V, is preferably equal to or greater than 250 μm when the VS-potential is 1700 V, and is preferably equal to or greater than 110 μm when the VS-potential is 400 V. That is, the thickness $d_{soi}$ of the semiconductor layer 1c increases such that the depletion layer 10 does not come into contact with the insulating layer 1b. In FIG. 5, a case in which the specific resistivity of the semiconductor layer 1c is, for example, 100 Ωcm is represented by a dotted line. In this case, similarly to the case in which the specific resistivity is 350 Ωcm, when the VS-potential is 600 V, the distance $L_1$ between the bottom of the first well region 2 and the insulating layer 1b is preferably equal to or greater than 80 μm.

When the depletion layer 10 comes into contact with the insulating layer 1b, the thickness of the insulating layer 1b needs to be equal to or greater than 2 μm in order to ensure the breakdown voltage with the insulating layer 1b. However, in the semiconductor integrated circuit 40 according to the first embodiment, the thickness $d_{soi}$ of the semiconductor layer 1c increases such that the depletion layer 10 does not come into contact with the insulating layer 1b. Therefore, it is not necessary to increase the thickness of the insulating layer 1b and there is no influence on the breakdown voltage even if the thickness is less than 1 μm.

When the VB-potential is lower than the VS-potential by 0.6 V or more due to a negative voltage surge, the collector current of the parasitic p-n-p bipolar transistor 29 flows through a current path from the bottom of the first well region 2 to the isolation region 5 through the semiconductor layer 1c and flows to the ground electrode 5a to which the GND potential is applied. The width $W_n$ of the breakdown-voltage improving-region 4 between the first well region 2 and the isolation region 5 is increased to increase a resistance component of the current path. Therefore, it is possible to reduce the current amplification factor $H_{FE}$ of the parasitic p-n-p bipolar transistor 29 and to suppress the operation of the parasitic p-n-p bipolar transistor 29. In general, in order to ensure the predetermined breakdown voltage, the width $W_n$ of the breakdown-voltage improving-region 4 is about 100 μm when the rated breakdown voltage is designed to be 600 V and is about 200 μm when the rated breakdown voltage is designed to be 1200 V. When the width $W_n$ of the breakdown-voltage improving-region 4 is the above-mentioned value, the resistance component of the current path from the bottom of the first well region 2 to the isolation region 5 through the semiconductor layer 1c increases and a large amount of collector current of the parasitic p-n-p bipolar transistor 29 does not flow to the ground electrode 5a.

The semiconductor chip 30 as the semiconductor integrated circuit 40 according to the first embodiment is bonded and fixed to the die pad 72 of the wiring substrate 70, with the adhesive 80 interposed between the semiconductor chip 30 and the die pad 72, during a mounting process, as illustrated in FIG. 6. In this case, as illustrated in FIG. 7, the adhesive 80 reaches the side edge of the semiconductor chip 30. When the adhesive 80 reaches the side edge of the semiconductor chip 30 and comes into contact with the side edge of the semiconductor layer 1c, a current path from the side edge of the semiconductor layer 1c to the die pad 72 through the adhesive 80 is formed. As a result, a collector current of the parasitic p-n-p bipolar transistor 29 flows to the die pad 72 through the current path. However, the semiconductor integrated circuit 40 according to the first embodiment includes the support substrate 1a which is laminated on the bottom surface of the insulating layer 1b. Therefore, it is possible to prevent the adhesive 80 that has reached the side edge of the semiconductor chip 30 from coming into contact with the side edge of the semiconductor layer 1c, as compared to the case in which the support substrate 1a is not provided. As a result, it is possible to prevent the formation of the current path through which the collector current of the parasitic p-n-p bipolar transistor 29 flows.

In the first embodiment, the insulating layer 1b is provided at the entire bottom surface of the semiconductor layer 1c. However, the insulating layer 1b may be selectively provided at the bottom surface of the semiconductor layer 1c so as to face at least the first well region 2.

In the first embodiment, when the semiconductor chip 30 is mounted, the bottom surface of the support substrate 1a is fixed to the GND potential. However, in the mounting of the semiconductor chip 30, in some cases, the bottom surface of the support substrate 1a may not be fixed to the GND potential so as to establish a floating state. When the semiconductor integrated circuit 40 according to the first embodiment is mounted in the floating state, no problems occur. Therefore, it is possible to use both the structure in which the potential of the bottom surface of the support substrate 1a is fixed and the structure in which the potential of the bottom surface of the support substrate 1a is not fixed.

Second Embodiment

Figure 8:
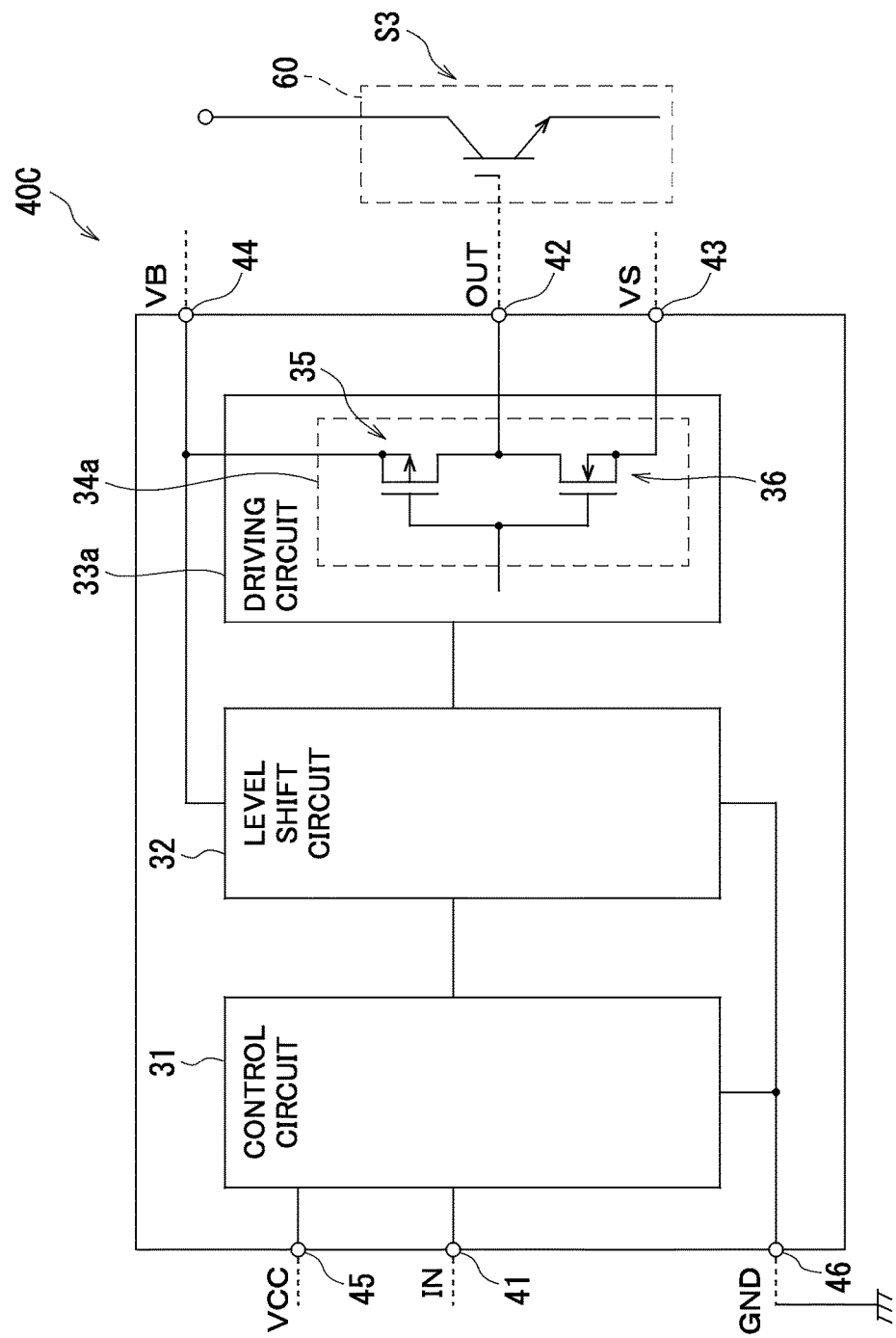
FIG. 8 is a circuit diagram schematically illustrating the structure of a semiconductor integrated circuit according to a second embodiment of the present invention.
Figure 9:
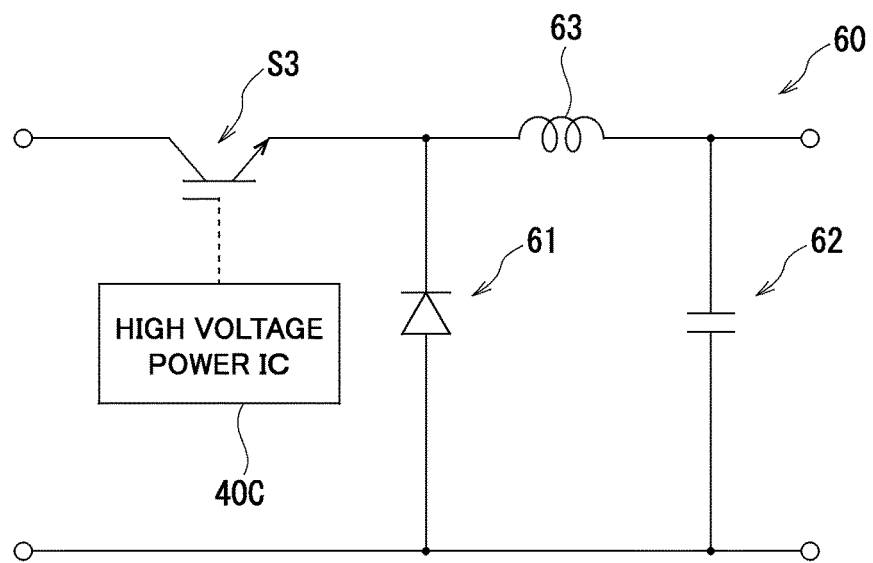
FIG. 9 is a circuit diagram schematically illustrating the structure of a step-down converter using the semiconductor integrated circuit according to the second embodiment of the present invention.

As illustrated in FIG. 8, a semiconductor integrated circuit 40C according to a second embodiment of the present invention is a power IC including, for example, a control circuit 31, a level shift circuit 32, and a driving circuit 33a. As illustrated in FIG. 8, the semiconductor integrated circuit 40C drives, for example, a switching element S3 of a step-down converter 60. As illustrated in FIG. 9, the step-down converter 60 includes, for example, a diode 61, a capacitor 62, a coil 63, and the switching element S3. The switching element S3 is an active element such as an IGBT.

The driving circuit 33a includes a gate driving circuit 34a. The gate driving circuit 34a has the same structure as the gate driving circuit 34 according to the first embodiment. Specifically, a source of a pMOS 35 is connected to a VB-terminal 44 and a drain of the pMOS 35 is connected to a drain of an nMOS 36. A source of the nMOS 36 is connected to a VS-terminal 43. A gate of the switching element S3 implementing the step-down converter 60 is connected to a connection point between the pMOS 35 and the nMOS 36.

The gate driving circuit 34a operates with a VS-potential of a second potential being applied to the VS-terminal 43, as a reference potential and a VB-potential of a first potential being applied to the VB-terminal 44, as a power-supply potential. The gate driving circuit 34a transmits a driving signal from an output terminal 42 in accordance with a signal received from the level shift circuit 32 to drive the switching element S3 of the step-down converter 60.

By the semiconductor integrated circuit 40C according to the second embodiment, which drives the switching element S3 of the step-down converter 60, similarly to the first embodiment, it is possible to suppress the operation of a parasitic p-n-p bipolar transistor 29 including a p⁻ second well region 3, an n⁻ first well region 2, and a p⁻ semiconductor layer 1c, similar to the configuration illustrated in FIG. 3.

In the second embodiment, the semiconductor integrated circuit which drives the switching element S3 of the step-down converter 60 has been explained. However, the invention is not limited thereto. For example, the invention can be applied to semiconductor integrated circuits for driving switching elements of a boost converter, a flyback converter, and a forward converter.

Other Embodiments

The invention has been explained above on the basis of the above-described embodiments. However, the invention is not limited to the above-described embodiments and various modifications and changes of the invention can be made without departing from the scope and spirit of the invention.

As described above, it is possible to improve the reliability of the semiconductor integrated circuit according to the invention and the semiconductor integrated circuit according to the invention can be useful for a semiconductor integrated circuit such as a HVIC which drives a switching element.

What is claimed is:

1. A semiconductor integrated circuit comprising:
   a semiconductor layer of a first conductivity type stacked on a support substrate with an insulating layer interposed between the semiconductor layer and the support substrate;
   a first well region of a second conductivity type buried in an upper part of the semiconductor layer so as to be separated from the insulating layer;
   a second well region of the first conductivity type buried in an upper part of the first well region; and
   an isolation region of the first conductivity type buried in the upper part of the semiconductor layer such that the isolation region surrounds the first well region and is separated from the first well region and the insulating layer so that the isolation region does not contact the first well region and does not contact the insulating layer.

2. The semiconductor integrated circuit of claim 1, wherein a thickness of the semiconductor layer is set such that the first well region and the isolation region are separated from the insulating layer.

3. A semiconductor integrated circuit comprising:
   a semiconductor layer of a first conductivity type laminated on an insulating layer;
   a first well region of a second conductivity type buried in an upper part of the semiconductor layer so as to be separated from the insulating layer;
   a second well region of the first conductivity type buried in an upper part of the first well region; and
   an isolation region of the first conductivity type buried in the upper part of the semiconductor layer such that the isolation region surrounds the first well region and is separated from the first well region and the insulating layer, wherein a thickness of the semiconductor layer is set such that the first well region and the isolation region are separated from the insulating layer, and
a distance between the first well region and the insulating layer is equal to or greater than 80 µm.

4. A semiconductor integrated circuit comprising:
a semiconductor layer of a first conductivity type laminated on an insulating layer;
a first well region of a second conductivity type buried in an upper part of the semiconductor layer so as to be separated from the insulating layer;
a second well region of the first conductivity type buried in an upper part of the first well region; and
an isolation region of the first conductivity type buried in the upper part of the semiconductor layer such that the isolation region surrounds the first well region and is separated from the first well region and the insulating layer, wherein
a thickness of the semiconductor layer is set such that the first well region and the isolation region are separated from the insulating layer, and
the thickness of the semiconductor layer is set such that a depletion layer which is spread from a p-n junction interface between the semiconductor layer and the first well region is separated from the insulating layer when a first potential is applied to the first well region and a second potential different from the first potential is applied to the second well region.

5. A semiconductor integrated circuit comprising:
a semiconductor layer of a first conductivity type laminated on an insulating layer;
a first well region of a second conductivity type buried in an upper part of the semiconductor layer so as to be separated from the insulating layer;
a second well region of the first conductivity type buried in an upper part of the first well region; and
an isolation region of the first conductivity type buried in the upper part of the semiconductor layer such that the isolation region surrounds the first well region and is separated from the first well region and the insulating layer, wherein
a thickness of the semiconductor layer is set such that the first well region and the isolation region are separated from the insulating layer,
a first potential is applied to the first well region,
a second potential different from the first potential is applied to the second well region, and
a reference potential is applied to the isolation region.

6. The semiconductor integrated circuit of claim 5, wherein a p-n junction between the first well region and the second well region is reversely biased by the first potential and the second potential during a normal operation.

7. The semiconductor integrated circuit of claim 4, further comprising:
a first active element having first and second main electrode regions of the first conductivity type buried in the upper part of the first well region; and
a second active element having first and second main electrode regions of the second conductivity type buried in an upper part of the second well region.

8. The semiconductor integrated circuit of claim 7, further comprising:
a gate driving circuit including the first active element and the second active element connected in series to each other,
wherein a gate of a switching element driven by the gate driving circuit is connected to a connection point between the first active element and the second active element.

9. The semiconductor integrated circuit of claim 7, further comprising a gate driving circuit including the first active element and the second active element connected in series to each other,
wherein, when a high-side circuit includes a high-side switching-element and a low-side switching-element connected in series to the high-side switching-element is driven by the gate driving circuit, a gate of the high-side switching-element is connected to a connection point between the first active element and the second active element.

10. The semiconductor integrated circuit of claim 8, wherein the second main electrode regions of the first and second active elements are connected to each other,
the first potential is applied to the first main electrode region of the first active element, and
the second potential is applied to the first main electrode region of the second active element.

11. A semiconductor integrated circuit comprising:
a semiconductor layer of a first conductivity type laminated on an insulating layer;
a first well region of a second conductivity type buried in an upper part of the semiconductor layer so as to be separated from the insulating layer;
a second well region of the first conductivity type buried in an upper part of the first well region; and
an isolation region of the first conductivity type buried in the upper part of the semiconductor layer such that the isolation region surrounds the first well region and is separated from the first well region and the insulating layer so that the isolation region does not contact the first well region and does not contact the insulating layer.

12. The semiconductor integrated circuit of claim 1, wherein the insulating layer faces the first well region.

13. A semiconductor integrated circuit comprising:
a semiconductor layer of a first conductivity type laminated on an insulating layer;
a first well region of a second conductivity type buried in an upper part of the semiconductor layer so as to be separated from the insulating layer;
a second well region of the first conductivity type buried in an upper part of the first well region; and
an isolation region of the first conductivity type buried in the upper part of the semiconductor layer such that the isolation region surrounds the first well region and is separated from the first well region and the insulating layer,
wherein the insulating layer is provided immediately below the first well region to reduce a current amplification factor of a parasitic bipolar transistor including the second well region, the first well region, and the semiconductor layer.

14. A semiconductor integrated circuit comprising:
a semiconductor layer of a first conductivity type laminated on an insulating layer;
a first well region of a second conductivity type buried in an upper part of the semiconductor layer so as to be separated from the insulating layer;
a second well region of the first conductivity type buried in an upper part of the first well region; and
an isolation region of the first conductivity type buried in the upper part of the semiconductor layer such that the isolation region surrounds the first well region and is separated from the first well region and the insulating layer, wherein a distance between a bottom of the first well region and the insulating layer is equal to or greater than 150 µm.

15. A semiconductor device comprising:

an insulating substrate;

a die pad laminated on the insulating substrate; and the semiconductor integrated circuit of claim 1, wherein a bottom surface of the insulating layer of the semiconductor integrated circuit is bonded and fixed to a top surface of the die pad by a conductive adhesive.

16. The semiconductor integrated circuit of claim 6, further comprising:

a first active element having first and second main electrode regions of the first conductivity type buried in the upper part of the first well region; and a second active element having first and second main electrode regions of the second conductivity type buried in an upper part of the second well region.

17. The semiconductor integrated circuit of claim 16, further comprising:

a gate driving circuit including the first active element and the second active element connected in series to each other, wherein a gate of a switching element driven by the gate driving circuit is connected to a connection point between the first active element and the second active element.

18. The semiconductor integrated circuit of claim 16, further comprising:

a gate driving circuit including the first active element and the second active element connected in series to each other, wherein, when a high-side circuit including a high-side switching-element and a low-side switching-element connected in series to the high-side switching-element is driven by the gate driving circuit, a gate of the high-side switching-element is connected to a connection point between the first active element and the second active element.

19. The semiconductor integrated circuit of claim 17, wherein the second main electrode regions of the first and second active elements are connected to each other, the first potential is applied to the first main electrode region of the first active element, and the second potential is applied to the first main electrode region of the second active element.

20. The semiconductor integrated circuit of claim 18, wherein the second main electrode regions of the first and second active elements are connected to each other, the first potential is applied to the first main electrode region of the first active element, and the second potential is applied to the first main electrode region of the second active element.

* * * * *